United States Patent
Chen et al.

(10) Patent No.: US 9,632,157 B2
(45) Date of Patent: Apr. 25, 2017

(54) METHOD AND APPARATUS FOR 3D MAGNETIC RESONANCE IMAGING

(71) Applicant: National Taiwan University, Taipei (TW)

(72) Inventors: Jyh-Horng Chen, Taipei (TW); Tzi-Dar Chiueh, Taipei (TW); Edzer Lienson Wu, Taipei (TW); Yun-An Huang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 973 days.

(21) Appl. No.: 13/853,275

(22) Filed: Mar. 29, 2013

(65) Prior Publication Data
US 2014/0292326 A1 Oct. 2, 2014

(51) Int. Cl.
G01V 3/00 (2006.01)
G01R 33/48 (2006.01)
G01R 33/561 (2006.01)
G01R 33/565 (2006.01)

(52) U.S. Cl.
CPC ....... G01R 33/4822 (2013.01); G01R 33/561 (2013.01); G01R 33/56545 (2013.01)

(58) Field of Classification Search
CPC .................................................. G01R 33/4822
USPC .......................................... 324/309, 307, 306
See application file for complete search history.

(56) References Cited

U.S. PATENT DOCUMENTS

| | | | | |
|---|---|---|---|---|
| 5,537,039 A * | 7/1996 | Le Roux | ............ | G01R 33/4822 324/307 |
| 6,968,225 B2 * | 11/2005 | Vu | ........ | G01R 33/482 324/309 |
| 8,022,701 B2 * | 9/2011 | Chen | ............ | G01R 33/446 324/309 |

\* cited by examiner

*Primary Examiner* — Louis Arana
(74) *Attorney, Agent, or Firm* — Chun-Ming Shih

(57) ABSTRACT

The present invention discloses a 3-dimension magnetic resonance imaging method which comprises: applying a slab selection gradient to a subject; transmitting a radiofrequency pulse to the subject, and exciting a slab of the subject to produce magnetic resonance signals with a continuous frequency bandwidth; performing a spatial encoding gradient across three dimensions to encode the magnetic resonance signals, wherein an equivalent encoded field of view which along the selected acceleration direction is controlled by the spatial encoding gradient, and the equivalent encoded field of view is shorter than the excited slab size of the subject; applying a separation gradient along with the spatial encoding gradient; and receiving and reconstructing the encoded magnetic resonance signals to produce 3D images.

12 Claims, 14 Drawing Sheets

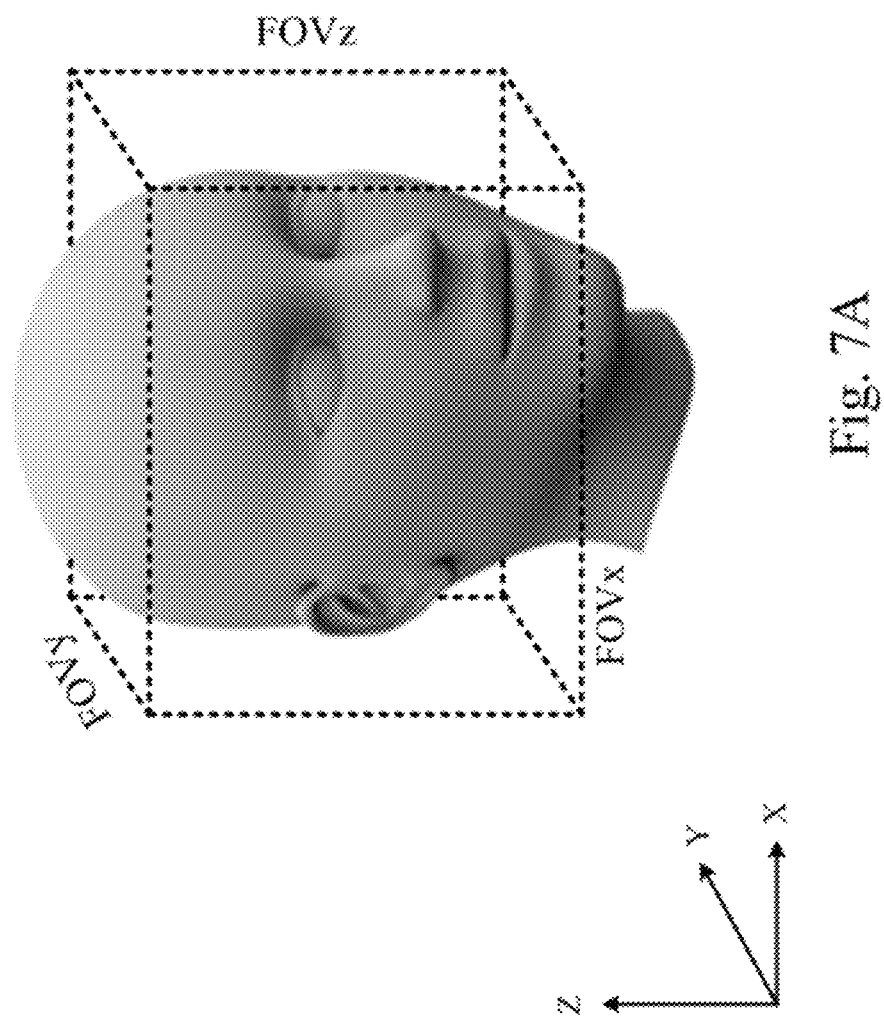

METHOD AND APPARATUS FOR 3D MAGNETIC RESONANCE IMAGING

BACKGROUND OF THE INVENTION

1. Field of the Invention

The present invention relates to a method and an apparatus for magnetic resonance imaging, particularly a method and an apparatus for 3D magnetic resonance imaging.

2. Description of the Prior Art

The principle of the 3D MRI is similar to that of the 2D MRI, where the main differences lie in RF excitation and spatial encoding.

Thin slices were excited in 2D MRI to obtain magnetic resonance signal within the specific thickness per repetition while in 3D MRI a much thicker slab containing information of multiple slices was excited. Also in 3D MRI, in addition to the two-dimensional spatial encoding a spatial encoding gradient $G_Z$ is further applied so that those nuclei in the excited slab will have certain phase differences in the Z-direction. Also, as opposed to the 2D reconstruction in 2D MRI a three-dimensional inverse Fourier transform (FT) is performed after the 3D k-space acquisition is completed, giving a 3D MR image space.

Referring to the U.S. Pat. No. 4,958,282, it's an image reconstruction method of the 3D FT type wherein the organization of the excitation and measuring sequences comprises the repetition of macro-sequences. During the macro-sequences, a selection encoding gradient which may have a small number of encoding steps (in particular, smaller than the expected resolution of the images) is applied. The prior patent shows that this approach enables the best possible power and flexibility of the vectorial processors used to perform image reconstruction computations, and the images can then be produced in real time. In conclusion, the method for the reconstruction of images acquired by NMR experiments on a body to be examined, the method comprising for the acquisition of the images: the execution of N macro-sequences, each of the N macro-sequences comprising L sequences, the sequences being designed for the excitation and measurement of NMR signals from the body; at each sequence, P samples of this NMR signal are measured; the method also comprising, in a vectorial computer, for the reconstruction of the images by a 3D FT type imaging method, for which the resolution L along one of the imaging axes of the images is smaller than the resolutions N and P along two other imaging axes of the images, the following steps in the following order: a first computation, over samples of the NMR signal, of N*L*P Fourier transforms with P computation steps, followed by: a second computation over results given by the first computation, of N*L*P Fourier transforms with L computation steps, followed by a third computation, over results given by the second computation, of N*L*P Fourier transforms with N computation steps, the final reconstruction of the images being achieved by the end of the third computation.

Referring to the U.S. Pat. No. 5,166,875, in an MRI system, three-dimensional data is acquired from a specific three-dimensional region of a subject to be examined. An image reconstruction process using two-dimensional Fourier transform is performed for two-dimensional data in one direction of the three-dimensional data. An image reconstruction process using 3D FT is performed for the three-dimensional data. In this case, a two-dimensional image is displayed before a three-dimensional image is displayed. In conclusion, the method for processing two- and three-dimensional data in an MRI system, comprising the steps of: acquiring three-dimensional data having a plurality of two-dimensional data; storing the acquired three-dimensional data; reading out one of the plurality of two-dimensional data from the stored three-dimensional data; reconstructing a two-dimensional image by a two-dimensional Fourier transform process for the read out two-dimensional data; displaying the reconstructed two-dimensional image; reading out the stored three-dimensional data; reconstructing a three-dimensional image by a three-dimensional Fourier transform process for the read out three-dimensional data; and displaying the reconstructed three-dimensional image after the reconstructed two-dimensional image is displayed.

According to the above description, both patents are traditional 3D MRI. In the present invention, we further provide a change in the encoded field of view and a separation gradient to decrease the total execution time of 3D MRI system, and to achieve high efficiency and accuracy.

SUMMARY OF THE INVENTION

The present invention discloses a 3D MRI method which comprises: applying a slab selection gradient to a subject by a gradient output module; transmitting a radiofrequency pulse to the subject by a radiofrequency (RF) excitation module, and exciting a slab of the subject to produce magnetic resonance signals with a continuous frequency bandwidth; performing a spatial encoding gradient across three dimensions by the gradient output module to encode the magnetic resonance signals, wherein an equivalent encoded field of view which along the selected acceleration direction is controlled by the spatial encoding gradient, and the equivalent encoded field of view is made shorter than the excited slab size of the subject; applying a separation gradient along with the spatial encoding gradient by the gradient output module; and receiving the encoded magnetic resonance signals by the radiofrequency (RF) receiving module, and reconstructing the encoded magnetic resonance signals into a 3D image space by an imaging processing module.

The equivalent encoded field of view of 3D MRI is defined by the equation:

$$FOV_n = 1/\Delta k_n \text{ where } \Delta k_n = \gamma G_n \Delta t \text{ or } \Delta k_n = \gamma t \Delta G_n$$

where n denotes either dimension in 3D space (X, Y or Z dimension), and $\Delta k_n$ denotes the step size of k-space along that dimension and it is the product of gyromagnetic ratio ($\gamma$), spatial encoding gradient strength $G_n$, and time duration between each sampling point $\Delta t$. The same effect of $\Delta k_n$ can also be achieved by a fixed gradient duration t and gradient strength step $\Delta G_n$, so that $\Delta k_n = \gamma t \Delta G_n$.

In the presented 3-dimension magnetic resonance imaging method, the equivalent encoded field of view along the selected acceleration direction is made shorter than the excited slab size of the subject by an acceleration factor W, which is the width of excited slab size divided by the width of encoded field of view along the selected acceleration direction ($W = th/FOV_{accel}$).

Also in the presented method, the encoded field of view along image separation direction ($FOV'_x$, X direction in this example) should be expanded according to the equation below:

$$FOV'_x = M * FOV_x$$

where $FOV_x$ is the field of view of a single image along the shift direction in normal 3D MRI, M is greater than or equal to the acceleration factor W so each cross section of the reconstructed 3D image space can accommodate multiple 2D images which are separated by the separation gradient.

The present invention discloses an apparatus for 3D MRI. The apparatus comprises a sequence controller, an RF excitation module, a gradient output module, an RF receiving module, and an imaging processing module.

The sequence controller may be used for controlling the RF excitation module, the gradient output module and the RF receiving module. It comprises steps of controlling the subject.

The RF excitation module may be used to apply a RF pulse that consists of one continuous frequency bandwidth per nuclei to excite a slab of a subject to produce magnetic resonance signals;

The gradient output module, may be used to control the magnitude and duration of gradients in three-dimensional space. The gradients are named after its main purpose such as spatial encoding gradient, selection gradient and separation gradient, etc.;

The RF receiving module may be used to receive the encoded magnetic resonance signals corresponding to the excited slab of a subject.

The imaging processing module may be used to reconstruct the received magnetic resonance signals.

BRIEF DESCRIPTION OF THE DRAWINGS

FIG. 7A is a chart of human head which is excited by a normal excitation thickness and a normal spatial encoding along the Z-direction;

DETAILED DESCRIPTION OF THE PREFERRED EMBODIMENT

Figure 1:
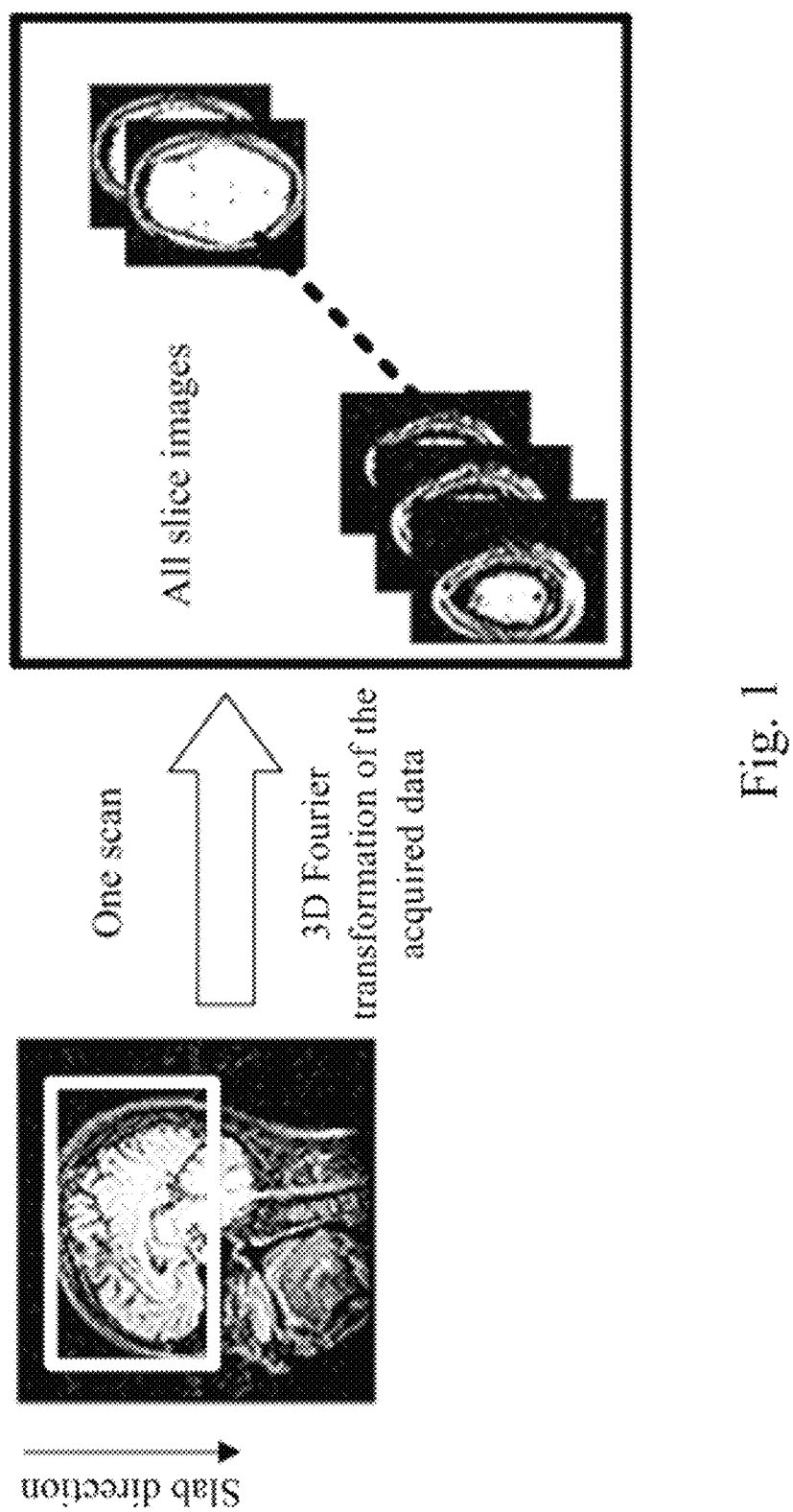
FIG. 1 is the image setting and outcome of a normal 3D MRI.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Referring to FIG. 1, in a conventional procedure of 3D MRI, only one single slab of the subject will be excited per scan to give the image information of the slab. The encoded field of view of all three dimensions was set to encompass the excited slab size. The acquired resonance signal may be reconstructed into a 3D image space through 3D inverse Fourier Transform (FT). The 3D image space can be seen as stacks of 2D images, here we show the axial images of an acquired human brain 3D MRI. Also, the time required for acquiring the 3D MRI signal is calculated as: scan time $T_{total}=TR*N_{pe}*N_z*NEX$. Thus, it is apparent that more time is required for acquiring the 3D MR image since the encoding steps are $N_z$ times greater than 2D MR imaging.

Figure 2:
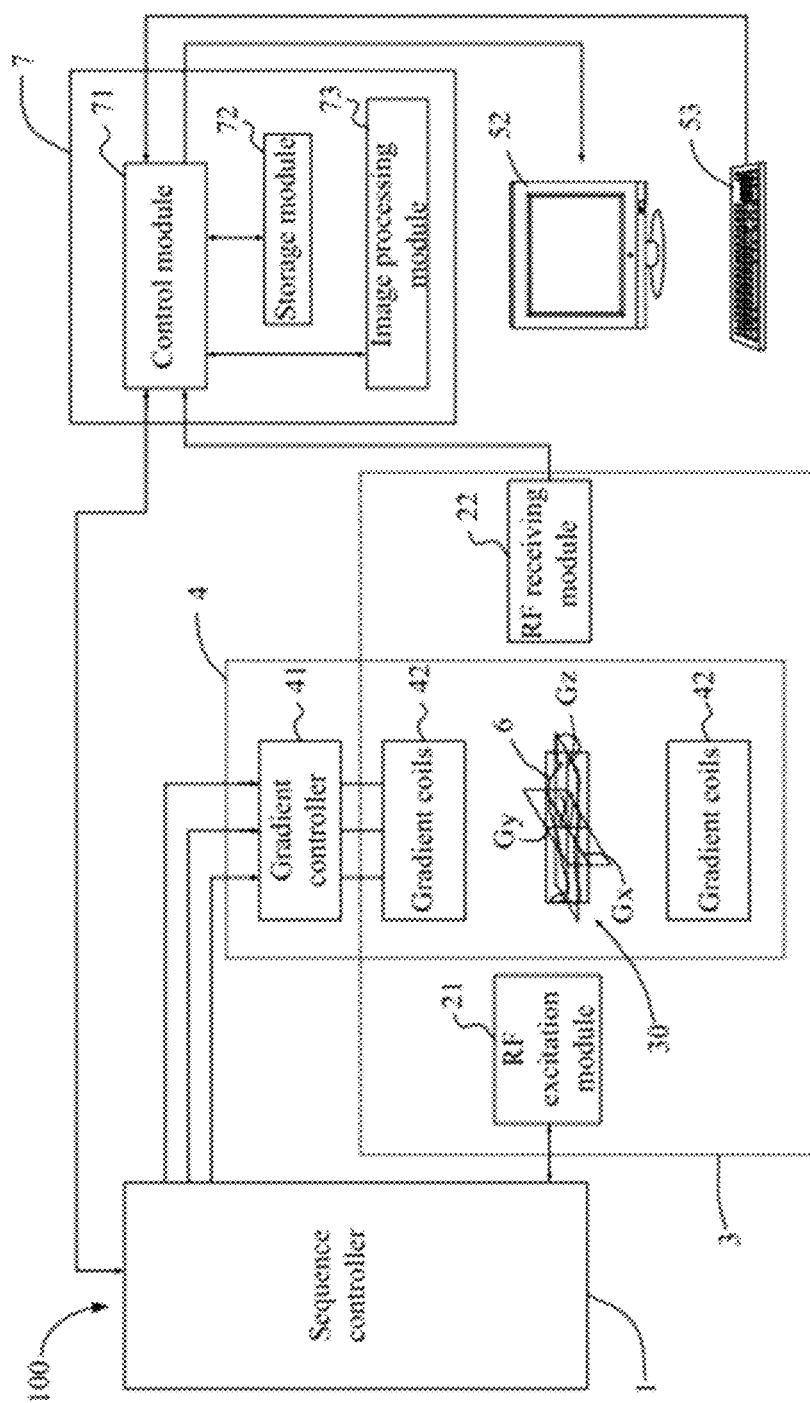
FIG. 2 is a diagram illustrating an example apparatus for acquiring one slab MRI signals in accordance with one embodiment.

FIG. 2 is a diagram illustrating an example apparatus 100 for acquiring a 3D MR image of a subject in accordance with one embodiment.

Referring to FIG. 2, the imaging apparatus 100 comprises a sequence controller 1, an RF excitation module 21 for emitting a RF waveform, an RF receiving module 22 for receiving magnetic resonance signals, a static magnetic field output module 3, a gradient output module 4, a main console 7, a display device 52, and an input device 53. The RF excitation module 21 and the RF receiving module 22 can either be single-channeled or multi-channeled. The gradient output module 4 can be provided with a gradient controller 41 and a plurality of gradient coils 42. The main console 7 has a control module 71, a storage module 72, and an image processing module 73.

A subject 6 can be positioned within a measurement space 30. In the measurement space 30, there are a uniform magnetic field generated by the static magnetic field output module 3 and a gradient generated by the gradient coils 42, which is under the control of the gradient controller 41. The uniform magnetic field cooperating with the gradient is used for the subject 6 to generate the magnetization as a source of the MRI signal.

Figure 3:
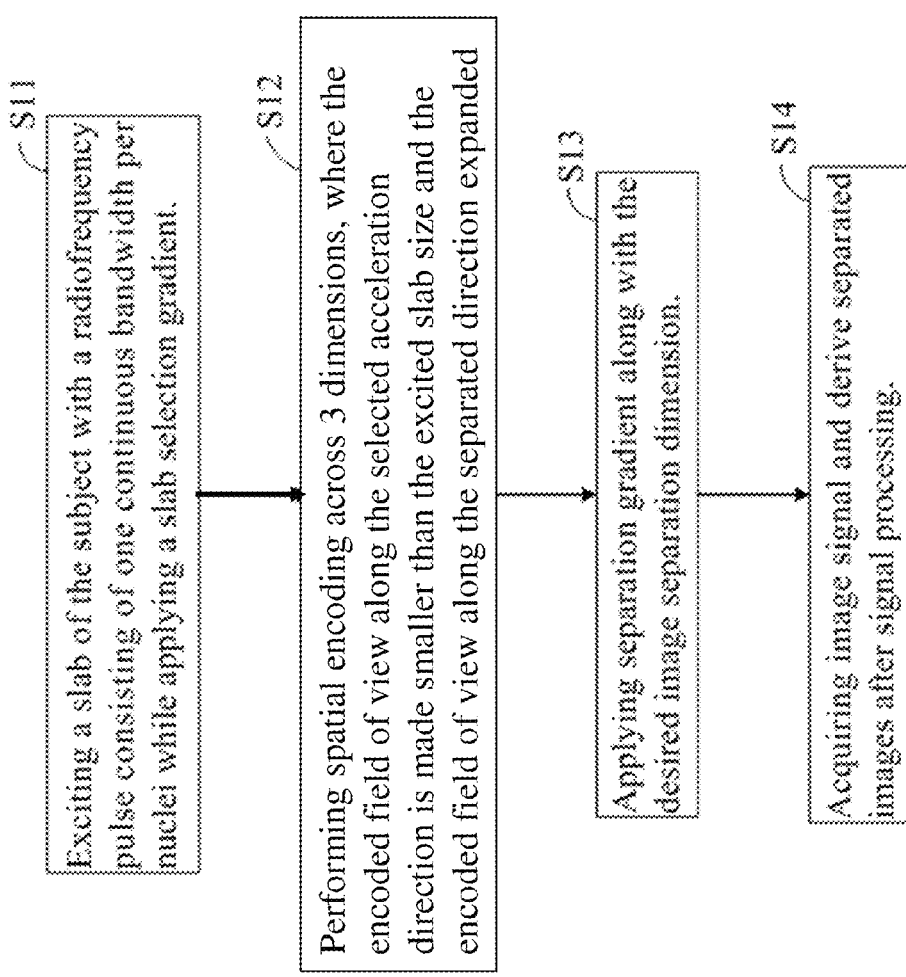
FIG. 3 is a flowchart illustrating an example method for the present invention in accordance with one embodiment.

FIG. 3 is a flowchart illustrating an example method for the present invention in accordance with one embodiment.

Referring to FIG. 2 and FIG. 3, in step S11, the RF excitation module 21 applies to the subject 6 with a radiofrequency (RF) pulse, which comprises one continuous frequency bandwidth, and a slab selection gradient so that a slab of the subject 6 corresponds to the one continuous frequency bandwidth is excited.

In step S12, the gradient output module 4 applies to the subject 6 a spatial encoding gradient $G_{spen}$, wherein the spatial encoding gradient $G_{spen}$ comprises gradients along all three dimensions: a spatial encoding along Y dimension ($G_Y$), a spatial encoding along X dimension ($G_X$), and a spatial encoding along Z dimension (Gz), note that X, Y, Z directions can be defined by the user.

One direction is chosen as the selected acceleration direction, the encoded field of view along the selected acceleration direction is made smaller than the excited slab size by a certain acceleration factor W ($W=th/FOV_{accel}$), th is the excited slab size, and $FOV_{accel}$ is the encoded field of view (spatial encoding width) along the selected acceleration direction. Another orthogonal direction is chosen as the separated direction, and that the encoded field of view along the separated direction should be expanded that it becomes M times of the FOV of a normal 3D MRI.

In step S13, the gradient output module 4 simultaneously applies a separation gradient $G_{sep}$ with one of the spatial encoding gradients.

In step S14, the RF receiving module 22 receives the MRI signals, and receives separated images after signal processing. The MRI signal is reconstructed by performing spatial encoding, and 3D inverse Fourier transform, so as to produce the 3D MRI image of the slab of subject 6.

The table listed below is an example of the gradients in the sequence and their dimensions in space. There are numerous other possibilities of the gradient dimensions that can properly implement the proposed invention.

| Gradient | Dimension setting #1 | Dimension setting #2 | Dimension setting #3 |
|---|---|---|---|
| Slab excitation | Z | Y | Z |
| Selected acceleration direction which field of view is decreased by a factor of W | Z | Z | X |
| Spatial encoding gradient which is applied simultaneously with the separation gradient & field of view expanded by a factor of M | X | X | Z |
| Separation gradient | Z | Z | X |

Figure 4:
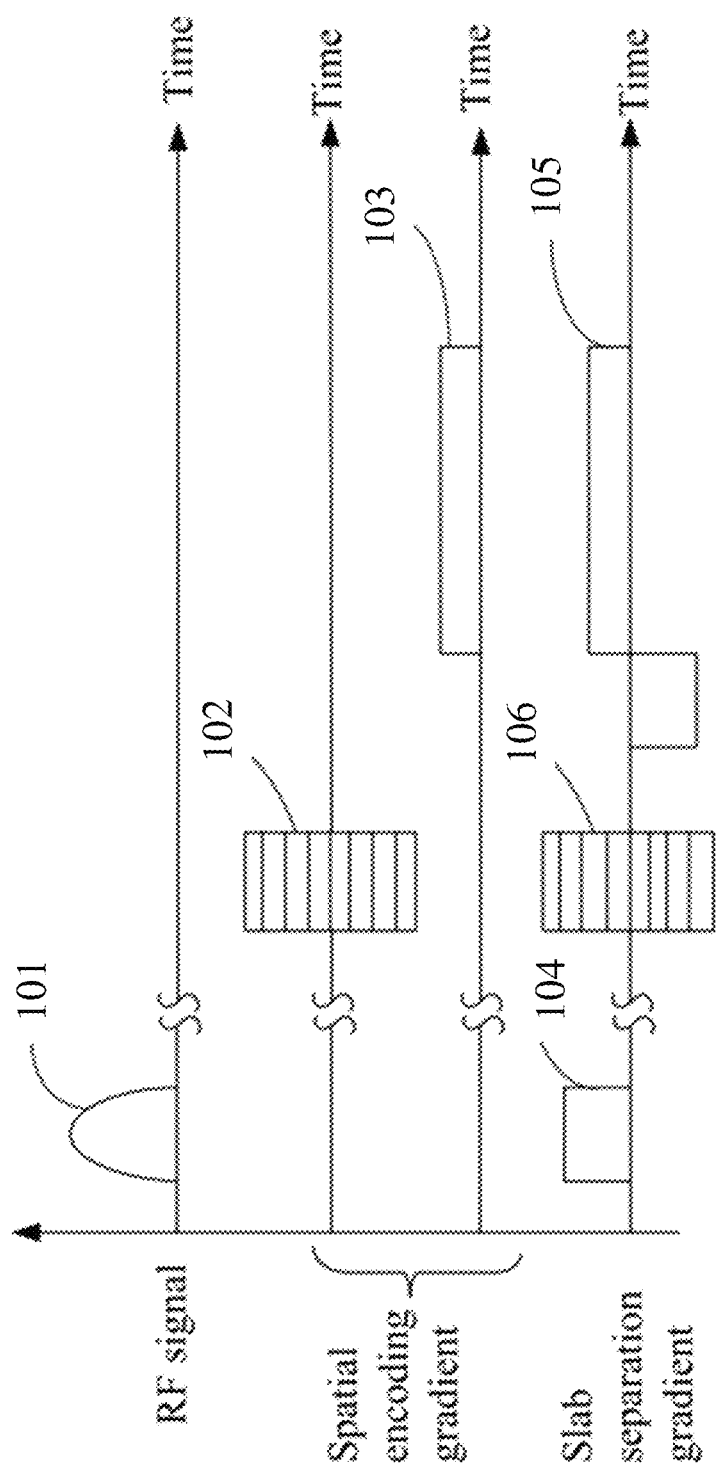
FIG. 4 is a timing chart illustrating control of the system of the present invention.

FIG. 4 is a timing chart illustrating control of the system of FIG. 2 when implementing the process of FIG. 3.

Referring to FIG. 2 and FIG. 4, the sequence controller 1 can be configured to output driving signals to drive and control the activation of the RF excitation module 21, the RF receiving module 22 and the gradient output module 4, wherein the steps of controlling in accordance with one embodiment are as follows.

i. The sequence controller 1 drives the RF excitation module 21 to generate to the subject 6 one RF excitation pulse 101 that comprises a continuous frequency bandwidth; yet, the sequence controller 1 drives the gradient controller 41 to control the gradient coils 42 for generating the slab-selection gradient $G_{ss}$ 104.
  ii. The sequence controller 1 applies a spatial encoding gradient $G_{spen}$ (102, 103, and 106) to the subject 6, with respect to the encoding direction for the slab of subject 6.
  iii. The sequence controller 1 drives the gradient controller 41 to control the plurality of gradient coils 42 to generate a separation gradient $G_{sep}$ 105 to the subject 6.

In this example, the spatial encoding gradient $G_{spen}$ comprises a gradient 102 (spatial encoding along Y), a gradient 103 (spatial encoding along X) and a spatial encoding along Z 106. In the course of applying the spatial encoding gradient $G_{spen}$ 103 a separation gradient $G_{sep}$ 105 is applied while the MRI excited signals from the subject 6 are received, the separation gradient is absent in normal MR imaging. The ratio of the added $G_{sep}$ 105 to $G_{spen}$ 103 should meet the equation: $G_{sep}/G_{spen} \geq FOV_{sep}/FOV_{accel}$ so that the aliased images with distance $FOV_{accel}$ along the selected acceleration direction can be completely separated in the final outcome image. Take a W=2 case example, if $FOV_{sep}$=20 cm, $FOV_{accel}$=10 cm, th=20 cm (hence W=th/$FOV_{accel}$=2), $G_{spen}$=0.5 G/cm, then $G_{sep}$ would have to be greater than or equal to 1 G/cm for the aliased images not to overlap in the final outcome.

Depending on the embodiment, the receiving module 22 can receive the MRI signals excited from the subject 6 while the spatial encoding gradient 103 and a separation gradient 105 are applied. The MRI signals can then be reconstructed by the image processing module 73 performing a 3D inverse Fourier transform, so as to give the real-time image data of the slab of the subject 6. The reconstructed data, which is the images of the excited slab, can then be output to be displayed on a display device 52.

Figure 5:
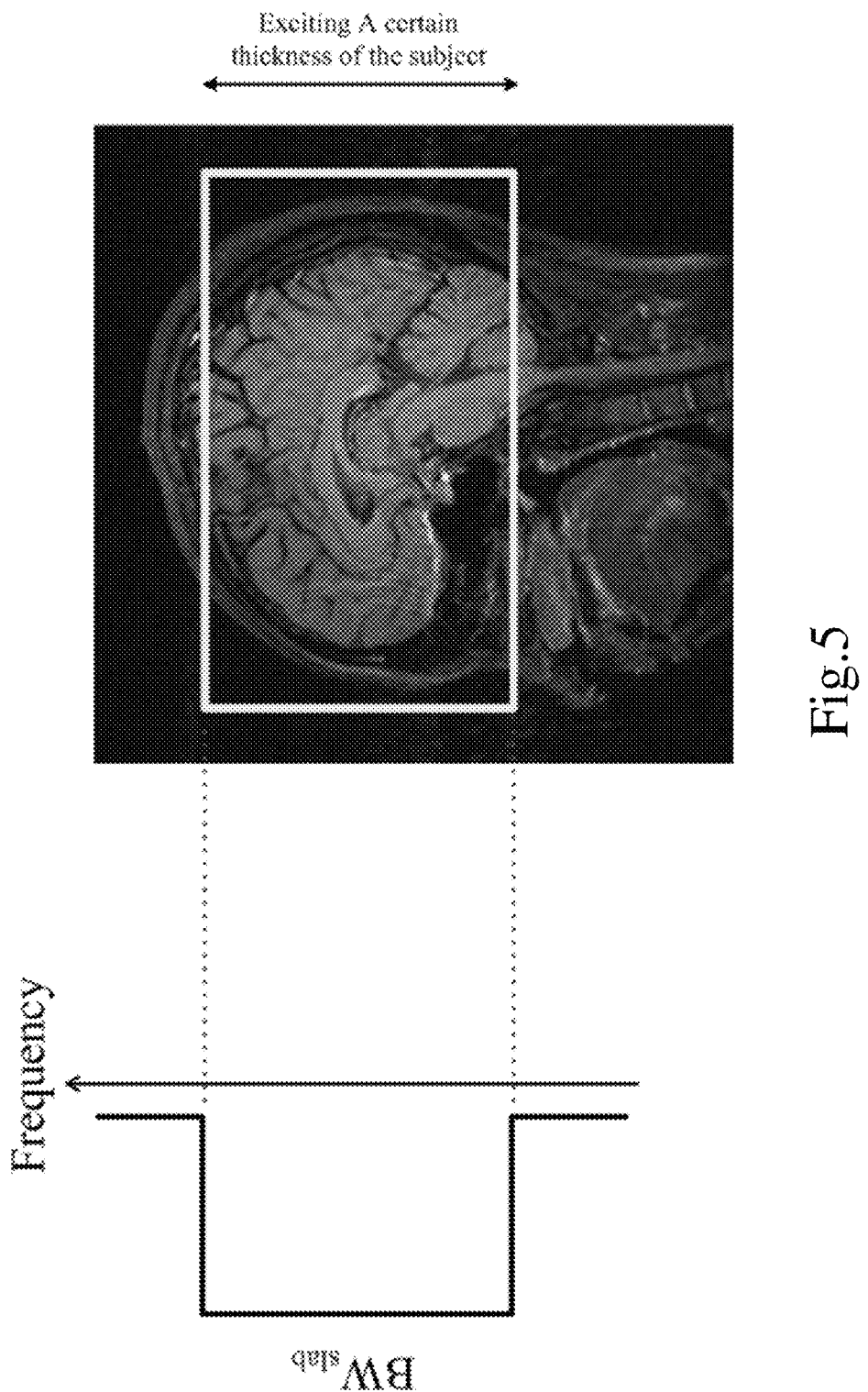
FIG. 5 is a chart of excited slab thickness.
Figure 6:
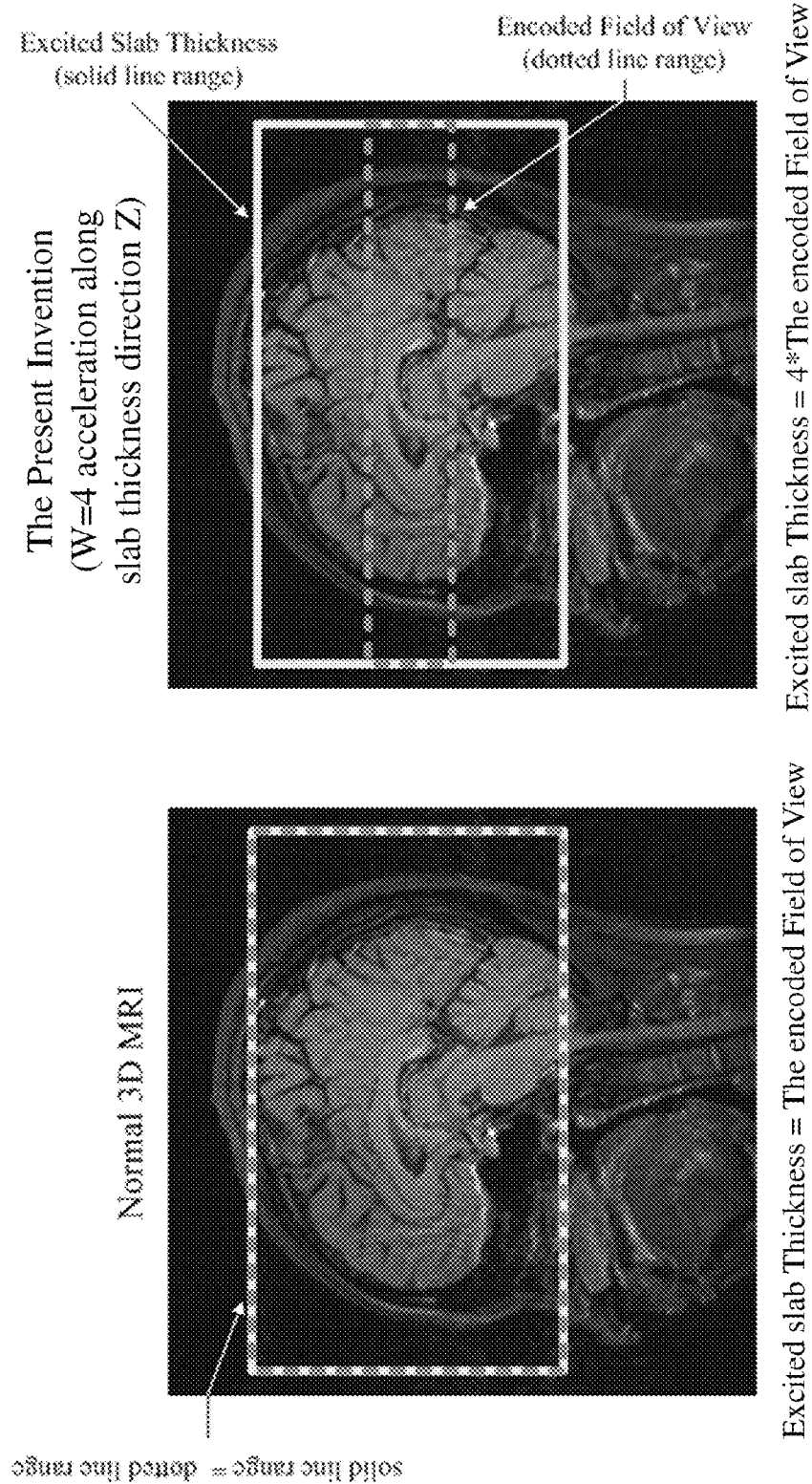
FIG. 6 is a comparability graph of the invention and normal 3D MRI.

Referring to FIG. 5 and FIG. 6. FIG. 5 is an excited slab thickness chart, a finite bandwidth of the RF pulse excites a certain thickness of the subject, on the other hand, the excited slab thickness th=$BW_{slab}/(G_{ss}*\gamma)$, where $BW_{slab}$ is the finite bandwidth of the RF pulse. FIG. 6 compares the present invention with normal 3D MRI. Wherein, the encoded field of view (spatial encoding) is equal to the excited slab size in normal 3D MRI, but the encoded field of view along the selected acceleration direction is reduced in the present invention. In this case we take the slab thickness direction as the selected acceleration direction, if the encoded field of view is a quarter of the excited thickness, then there are four images in a single cross section of the 3D MR image along the slab direction. To achieve such an effect, the ratio of the encoded field of view and the slab thickness should obey W=th/$FOV_{accel}$, where W is acceleration factor, th is the excited slab size, and $FOV_{accel}$ is the encoded field of view (spatial encoding width) along the selected acceleration direction. By changing the ratio W, we can determine how many MRI slice images per graph. In this embodiment, W=4.

In order to more clearly explain the present invention, another embodiment will be described below by referring to the FIGS. 7A~8E, the selected acceleration dimension is along Z ($FOV_{accel}=FOV_z$). Shown in FIG. 7A, a subject (human head) is excited by a normal excitation thickness th and a spatial encoding along the Z-direction (the encoded field of view along the Z-direction, $FOV_{accel}=FOV_z$) which corresponds to the normal excitation thickness in normal 3D MRI (the encoded field of view along the Z-direction is equal to the excitation thickness th). In a normal 3D MRI there will be $N_z$ steps of encoding along the Z-direction during the spatial encoding process. After performing 3D inverse Fourier transform of the acquired data, one will have a 3D image space of the subject. The 3D image space can be seen as $N_z$ 2D images stacked along the Z-direction, each of the 2D images reveals information of the corresponding location. Three (label 1, 2 and 3) of the $N_z$ images correspond to three locations (label A, B and C) respectively are shown in FIG. 7B.

Figure 7B:
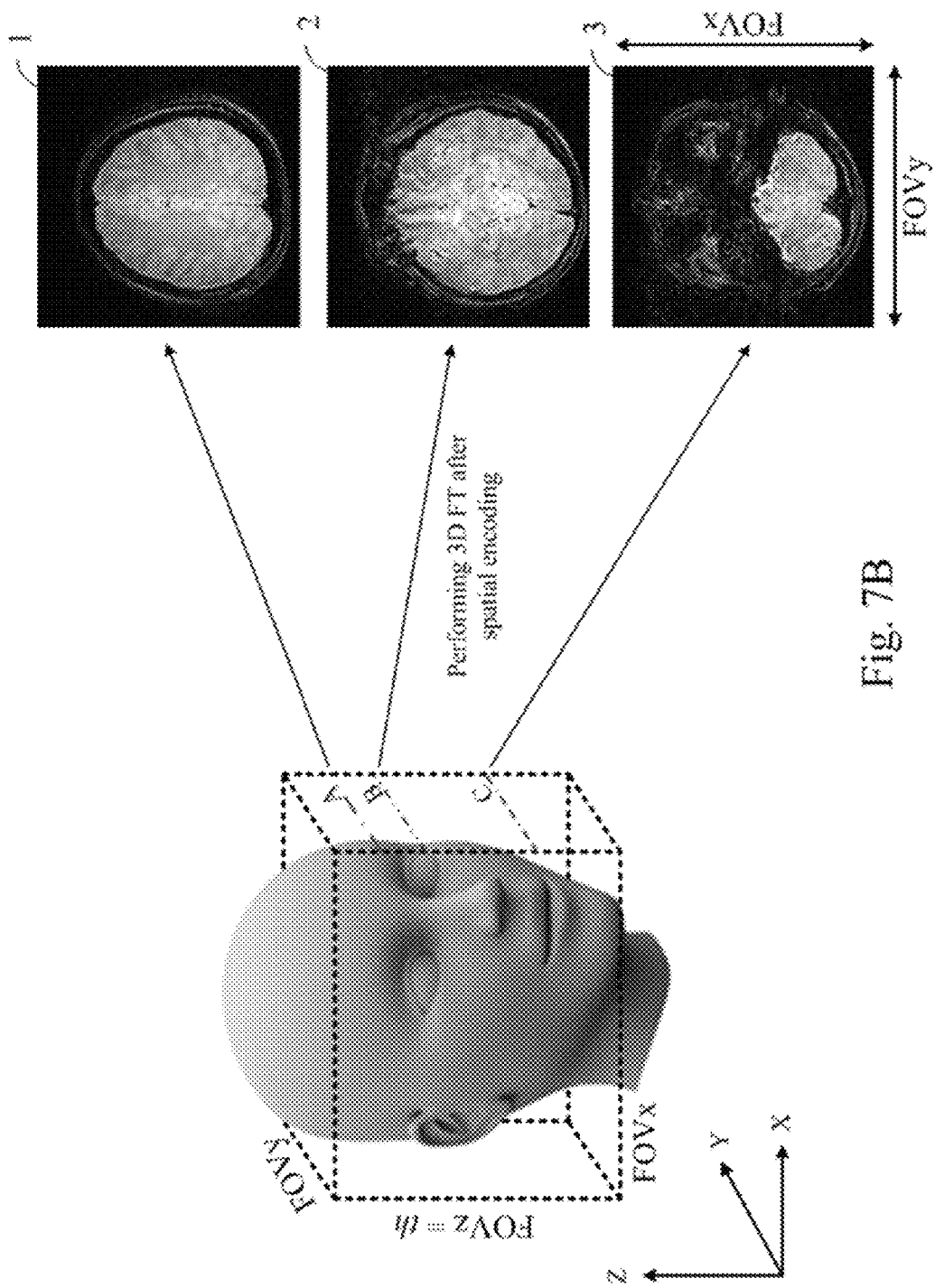
FIG. 7B shows reconstructed images of normal 3D MRI.
Figure 8A:
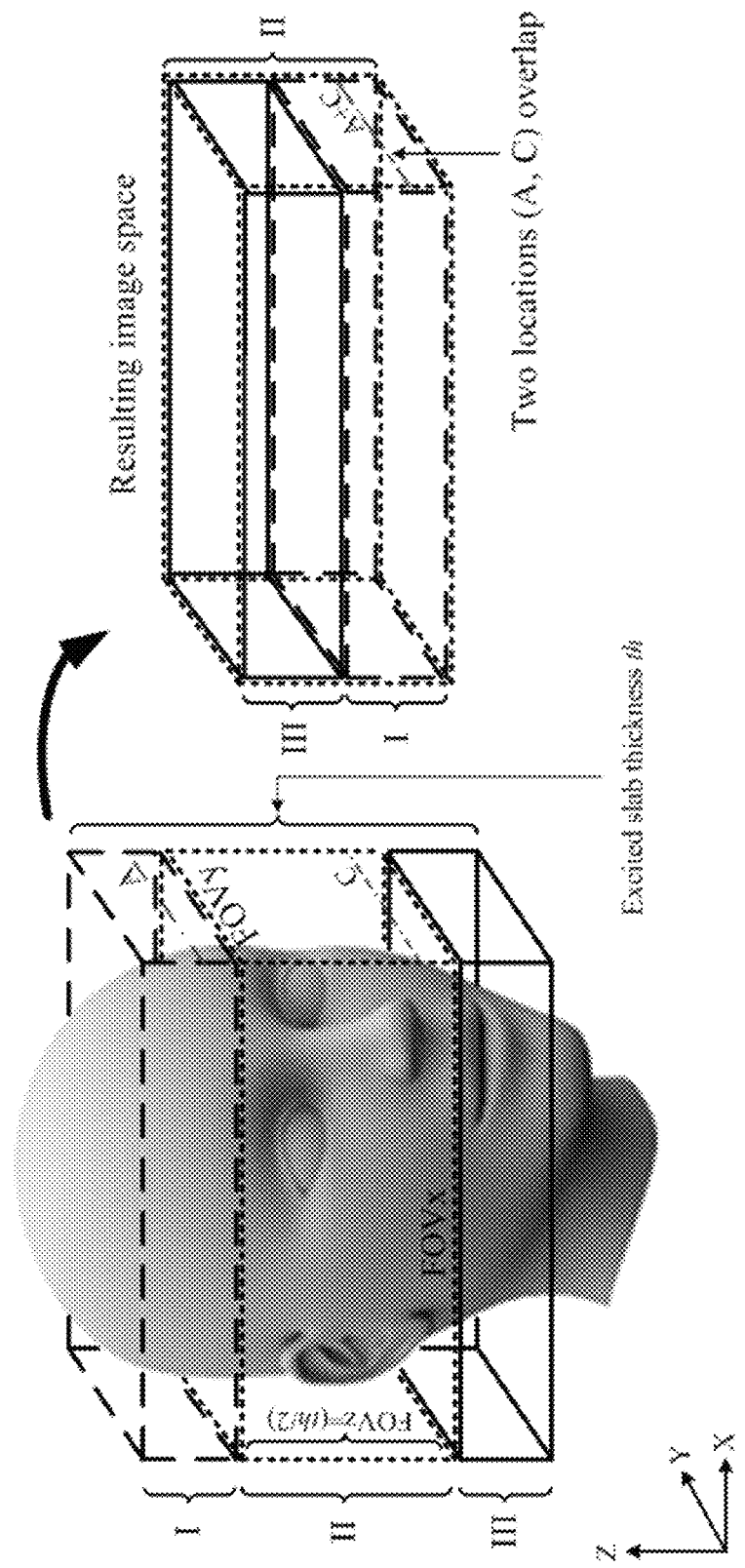
FIG. 8A is a chart of human head that is excited by a normal excitation thickness and a normal spatial encoding along the Z-direction ($FOV_z$) which is half of the normal excitation thickness.
Figure 8B:
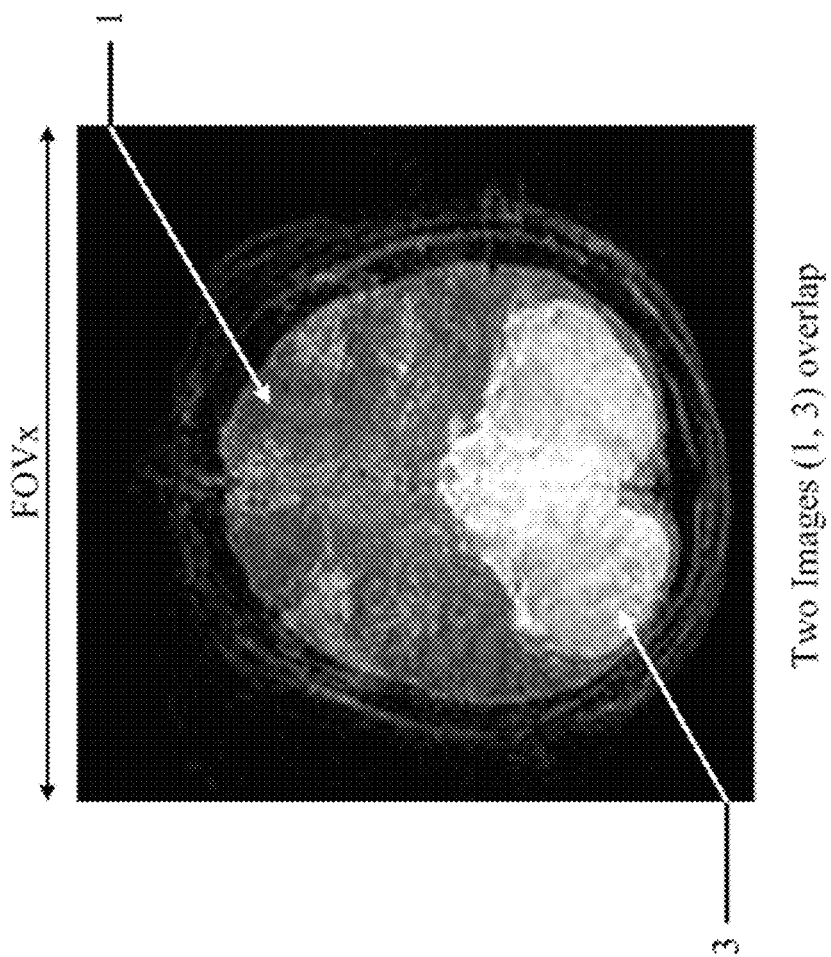
FIG. 8B is a reconstructed image of FIG. 8A.

Shown in FIGS. 7A and 7B, in normal 3D MRI, the encoded field of view along Z-direction is set to be the same as the excited slab thickness ($FOV_z$=th). Once the $FOV_z$ is smaller than th, image aliasing along Z-direction occurs. What happens is signal outside of the encoded field of view $FOV_z$ will appear inside the $FOV_z$, causing overlapping of images with different locations that are $FOV_z$ apart in space. The effect of image aliasing is shown in FIGS. 8A and 8B where 2 images of locations that are $FOV_z$ apart (image 1 and 3 in FIG. 7B) overlaps in one of the reconstructed images. As shown in FIG. 8A, the spatial encoding was marked "II", wherein the spatial encoding $FOV_z$ equals th/2 (the region of excited slab includes I, II and III in the left side of FIG. 8A, and II is the region of spatial encoding, but for explaining the case of aliasing clearly, we use different lines to clearly indicate these three regions, and using a gap between two lines to show the extent of those regions clearly. Actually, there is no gap between regions I, II and III). When aliasing, shown in the right side of FIG. 8A, Region I aliases toward the bottom of region II and region III aliases to the top of region II. In this case, the image of location A overlaps onto the image of location C. The number of $N_z$ is also half of the original value, resulting in half the scan time.

In this embodiment, first the field of view along the selected acceleration direction $FOV_z$ was intentionally set to be smaller than the excited slab thickness th while the excited thickness remains unchanged. This setting forces the image to alias. The number of encoding along the selected direction Z ($N_z$) was also proportionally adjusted according to the $FOV_z$. In FIG. 8A, the $FOV_z$ is half the slab thickness.

Figure 8C:
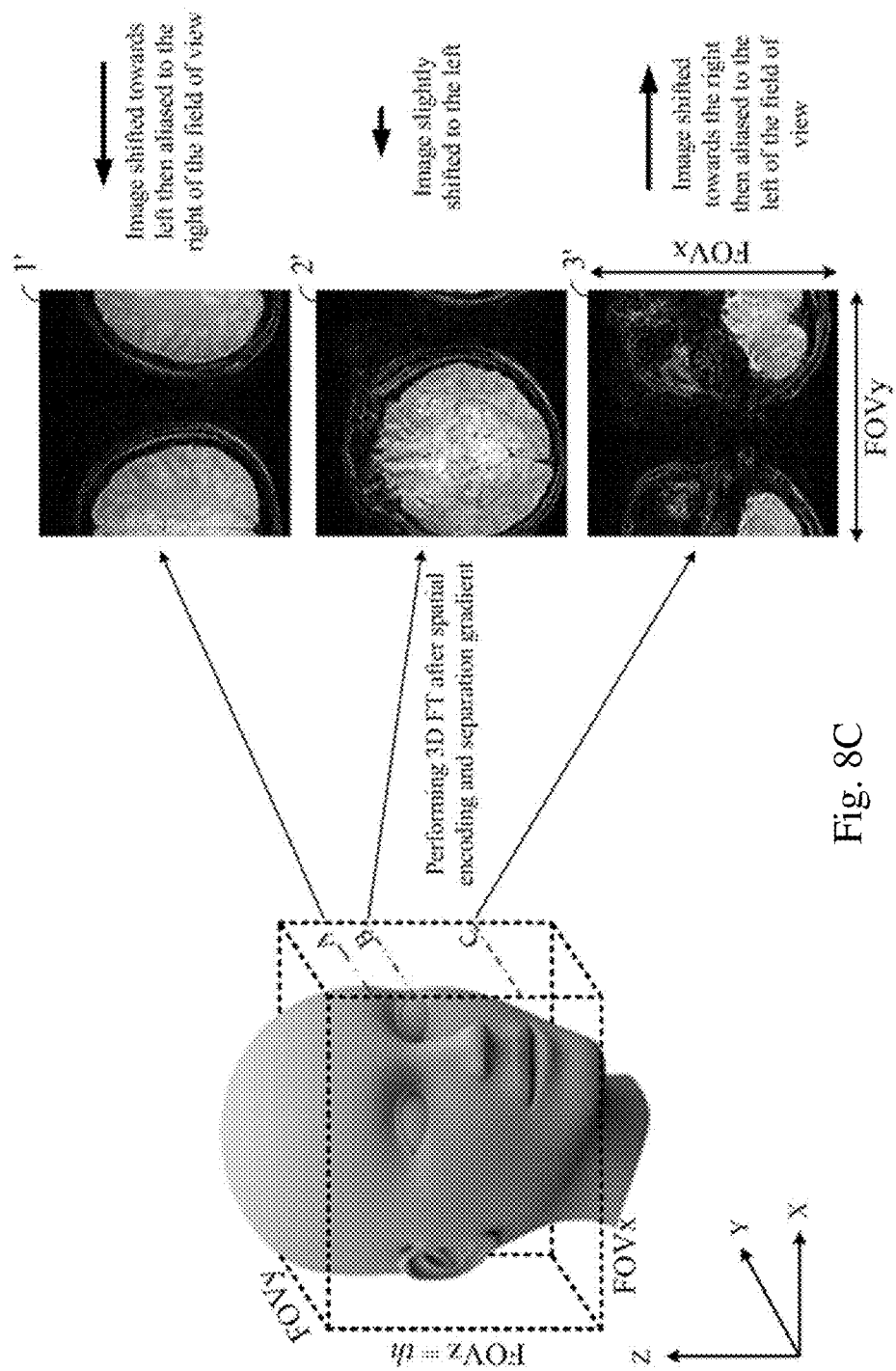
FIG. 8C shows reconstructed images of normal 3D MRI when a separation gradient is provided.

In order to acquire non-overlapping accelerated images, the present invention applies a separation gradient during signal acquisition. The addition of separation gradient during signal sampling causes the images in the reconstructed image set to shift. The effect is shown in FIG. 8C, where the direction and magnitude of shift is determined by location and the separation gradient strength. Each of the $N_z$ images will produce an image shift (label 1', 2' and 3') with different direction and magnitude if a separation gradient is arranged for the normal 3D MRI. As a result, the overlapping images were forced to move away from each other. However, the encoded field of view along X-direction ($FOV_x$) limits the size of the width of the MRI graph.

Figure 8D:
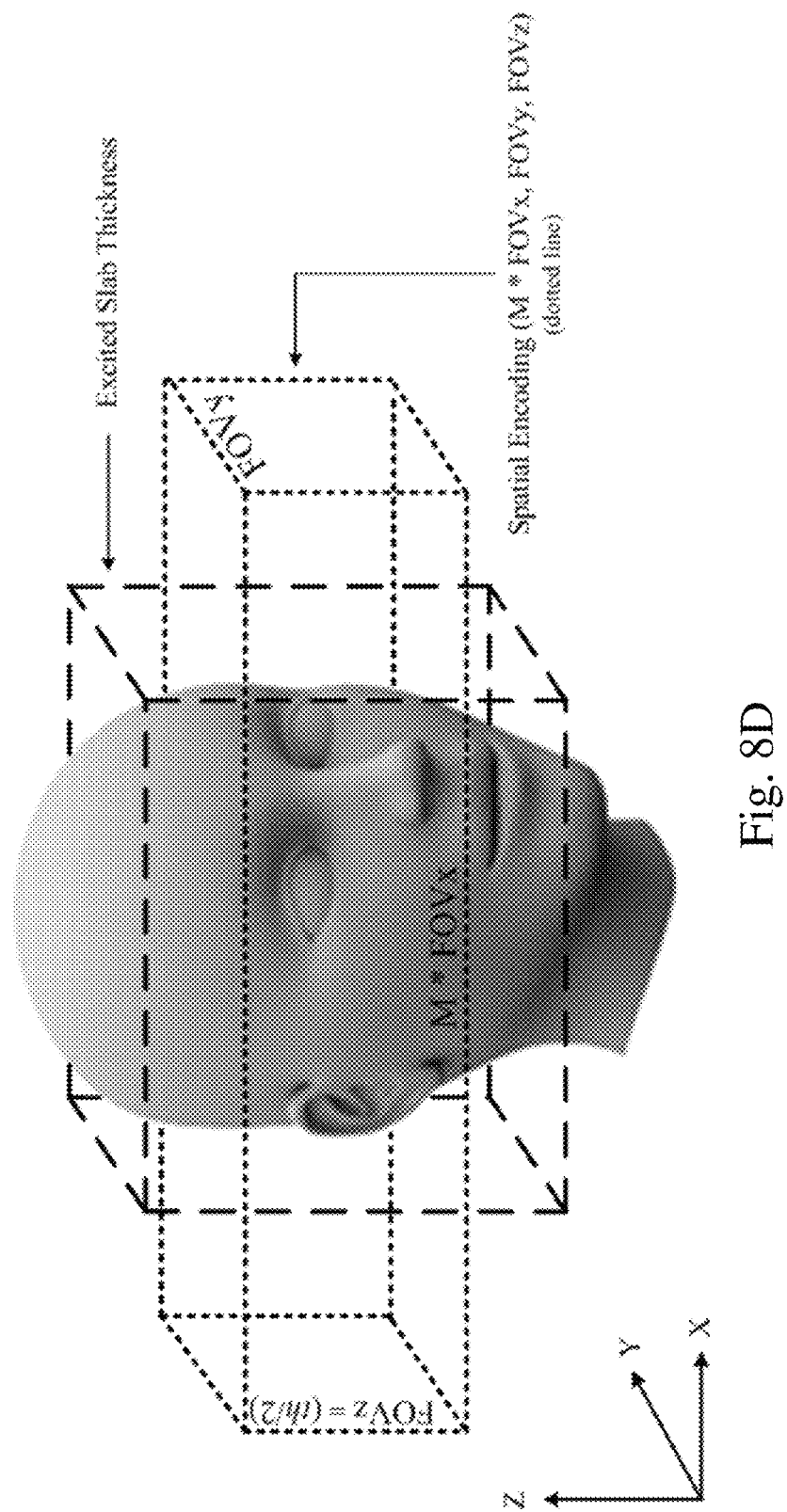
FIG. 8D is a chart of human head that is excited by a normal excitation thickness and a normal spatial encoding along the Z-direction ($FOV_z$) which is half of the normal excitation thickness, and a separation gradient is provided.
Figure 8E:
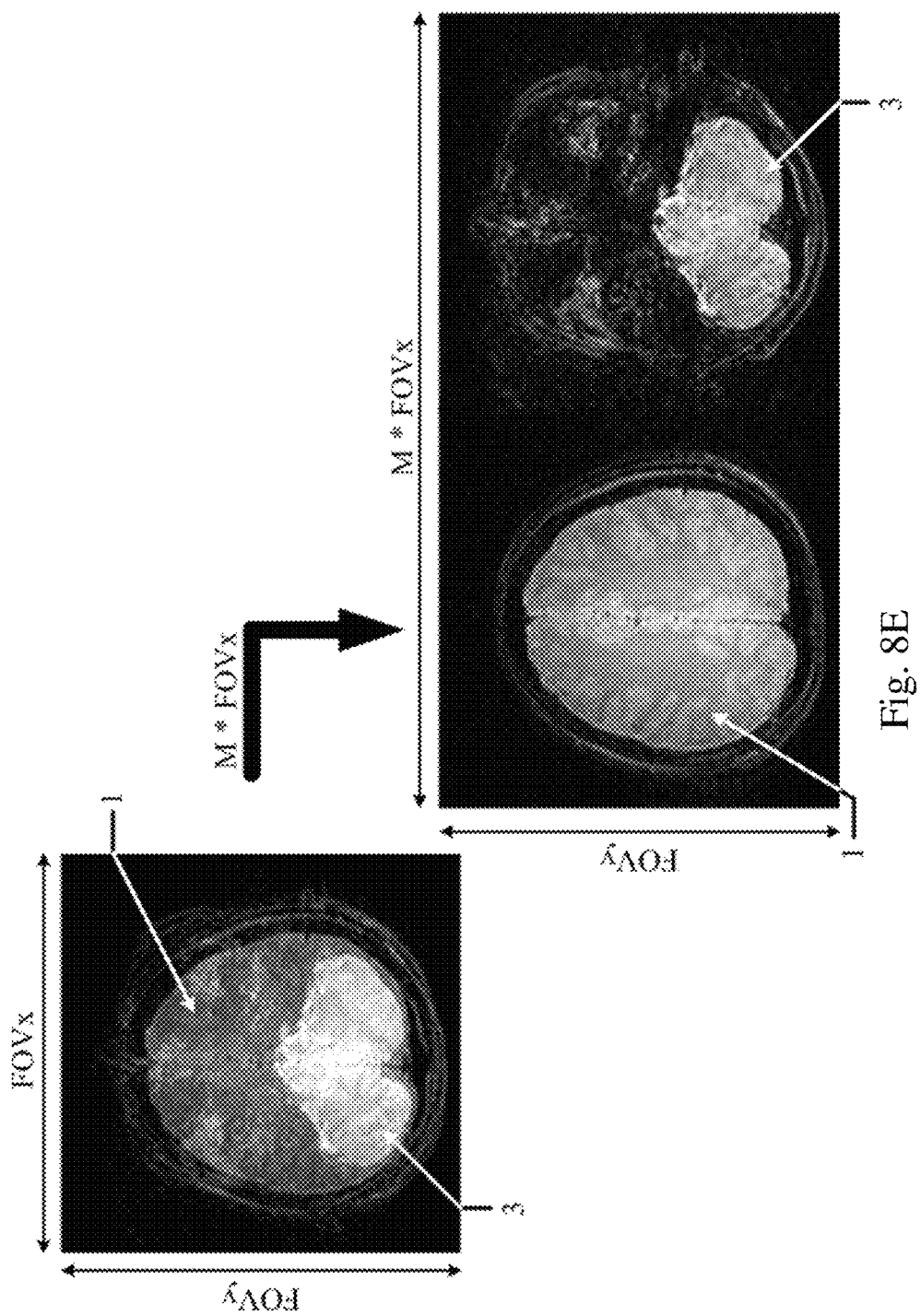
FIG. 8E is the reconstructed image of FIG. 8D.

The solution is to increase $FOV_x$ to enclose multiple images in one MRI graph in the embodiment as shown in FIGS. 8D and 8E. The acceleration factor W equals 2, and the ratio M for expanding $FOV_x$ is also 2 (M is greater than or equal to W).

Figure 9:
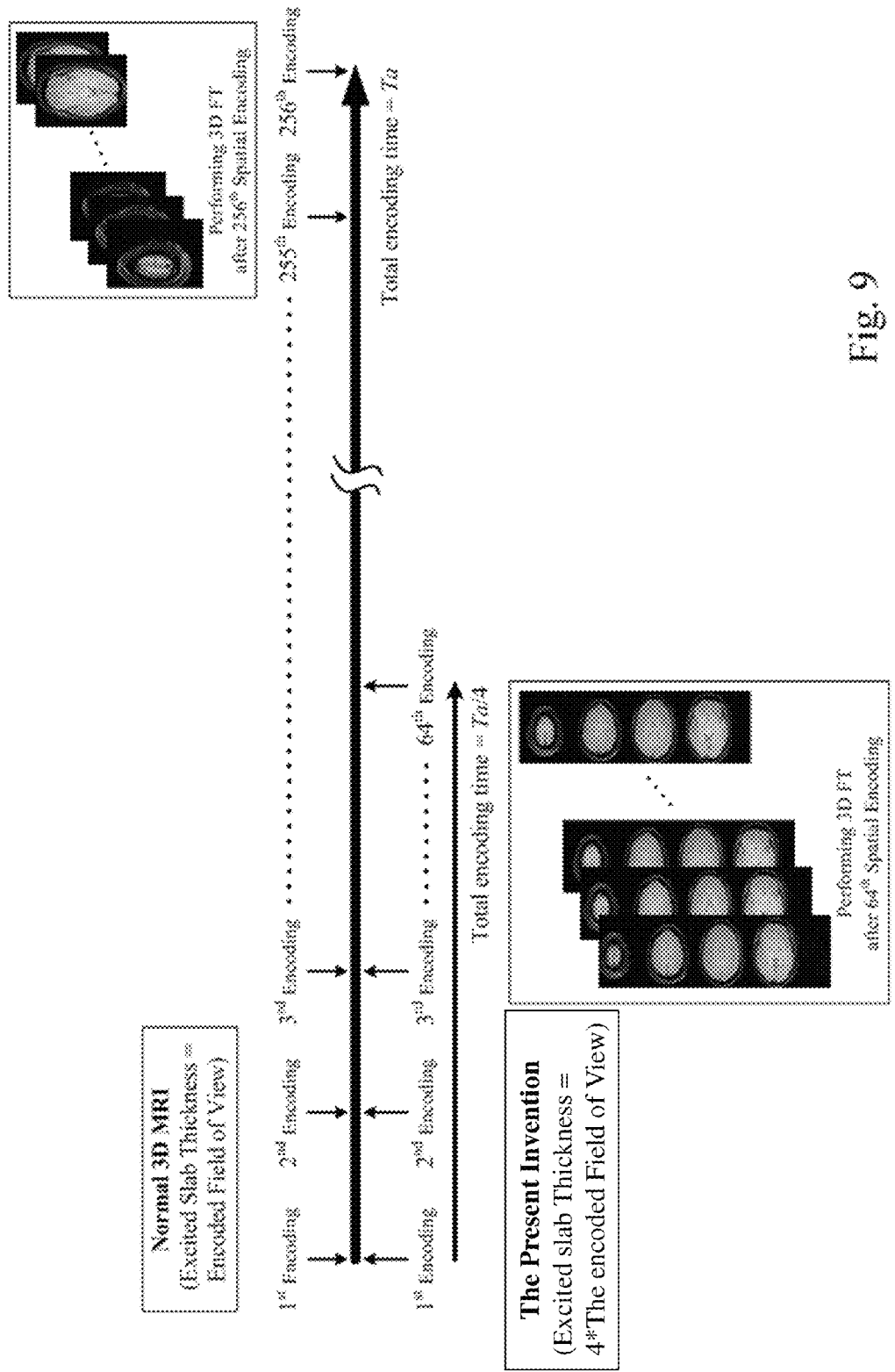
FIG. 9 is an encoding time flowchart of normal 3D MRI and the present invention.

Referring to FIG. 9, which is an encoding time flowchart of normal 3D MRI and the present invention. It can produce an image space of 256 MRI images along slab direction of a subject in normal 3D MRI, and after performing 3D FT and reconstruction, only one location of the subject in one MRI graph. The present invention can adjust the proportion relation between the excited thickness and the encoded field, shown in FIG. 9, in this embodiment, the number of encodings ($N_z$) of normal 3D MRI is quadruple of the invention when the excited thickness is quadruple of the encoded field of view (W=4), and the encoded field of view along the dimension of image shift direction ($FOV_x$ in this example) is also quadrupled in this embodiment (M=4), and there are four locations in one cross section of the reconstructed 3D image space. The total acquisition time of the present invention is only a quarter of normal 3D MRI, determined by the reduction in $N_z$.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method of three-dimensional magnetic resonance imaging, using a sequence controller to execute the steps comprising:
   applying a slab selection gradient to a subject by a gradient output module;
   transmitting a radiofrequency (RF) pulse to the subject by a RF excitation module, and exciting a slab of the subject to produce a plurality of magnetic resonance signals with a continuous frequency bandwidth;
   performing a spatial encoding gradient across three dimensions by the gradient output module to encode the magnetic resonance signals, wherein an equivalent encoded field of view along a selected acceleration direction is controlled by the spatial encoding gradient, and is made shorter than an excited slab size and the equivalent encoded field of view along an image separation direction expands;
   applying a separation gradient ($G_{sep}$) along with the spatial encoding gradient ($G_{spen}$) by the gradient output module to produce a plurality of encoded resonance signals; and
   receiving the encoded magnetic resonance signals by an RF receiving module, and reconstructing the encoded magnetic resonance signals into a 3D image space by an imaging processing module.

2. The method according to claim 1, wherein the equivalent encoded field of view (FOV) is defined by the equation:

$$FOV_n=1/\Delta k_n, \text{ where } \Delta k_n=\gamma G_n\Delta t \text{ or } \Delta k_n=\gamma t\Delta G_n$$

where n denotes either dimension in 3D space (X, Y or Z dimension), and $\Delta k_n$ denotes the step size of k-space along that dimension which is a product of gyromagnetic ratio ($\gamma$), spatial encoding gradient strength ($G_n$), and time duration between each sampling point ($\Delta t$), and the same effect of $\Delta kn$ is also achieved by a fixed gradient duration (t) and assigning gradient strength step ($\Delta G_n$), so that $\Delta k_n=\gamma(\Delta G_n)t$.

3. The method according to claim 2, wherein the equivalent encoded field of view along the selected acceleration direction is made shorter by an acceleration factor (W).

4. The method according to claim 3, wherein the acceleration factor (W) is the excited slab size divided by the width of encoded field of view along the selected acceleration direction (W=th/$FOV_{accel}$).

5. The method according to claim 4, wherein the equivalent encoded field of view along the image separation direction $FOV'_n$ is expanded according to the equation:

$$FOV'_n=M*FOV_n,$$

where $FOV_n$ is the field of view of a single image along a shift direction n and n is X, Y, or Z dimension, and M is greater than or equal to the acceleration factor (W) so that each cross section of a reconstructed 3D image space accommodates multiple images which are separated by the separation gradient in one graph.

6. The method according to claim 5, wherein the separation gradient ($G_{sep}$) meets the equation: $G_{sep}/G_{spen} \geq FOV_n/FOV_{accel}$ so that aliased images with distance $FOV_{accel}$ are completely separated in a final outcome image.

7. An apparatus for acquiring three-dimensional magnetic resonance images, comprising:
   an radiofrequency (RF) excitation module, used to apply an RF pulse to a subject and therefore excite a slab of the subject to produce a plurality of magnetic resonance signals with a continuous frequency bandwidth;
   a gradient output module, used to control magnitude and duration of a slab selection gradient, a spatial encoding gradient ($G_{spen}$) and a separation gradient ($G_{sep}$) in a three-dimensional space;
   wherein the slab selection gradient is applied to the subject to select a desired slab of the subject;
   wherein the spatial encoding gradient ($G_{spen}$) across three dimensions is applied to the subject to encode the plurality of magnetic resonance signals, and the spatial encoding gradient also controls an equivalent encoded field of view along a selected acceleration direction;
   wherein the equivalent encoded field of view along the selected acceleration direction is made smaller than an excited slab size and the equivalent encoded field of view along an image separation direction expands;

wherein the separation gradient ($G_{sep}$) is a applied to the subject alone with the spatial encoding gradient to produce a plurality of encoded magnetic resonance signals;

an RF receiving module, used to receive the plurality of encoded magnetic resonance signals corresponding to the excited slab of the subject; and an imaging processing module, connected to the RF receiving module and used to reconstruct a 3D image space with the encoded magnetic resonance signals received by the RF receiving module; and a sequence controller, connected to the RF excitation module, the gradient output module and the imaging processing module, and used for controlling the RF excitation module, the gradient output module and the RF receiving module.

8. The apparatus according to claim 7, wherein duration and strength of the spatial encoding gradient determine the equivalent encoded field of view (FOV) by the equation:

$$FOV_n = 1/\Delta k_n \text{ where } \Delta k_n = \gamma G_n \Delta t \text{ or } \Delta k_n = \gamma t \Delta G_n$$

where n denotes either dimension in a 3D space (X, Y or Z dimension), and $\Delta k_n$ denotes the step size of k-space along that dimension which is the product of gyromagnetic ratio ($\gamma$), spatial encoding gradient strength ($G_n$), and time duration between each sampling point ($\Delta t$), and the same effect of $\Delta k_n$ is also achieved by a fixed gradient duration t and assigning gradient strength step ($\Delta G_n$), so that $\Delta k_n = \gamma(\Delta G_n)t$.

9. The apparatus according to claim 8, wherein the equivalent encoded field of view along the selected acceleration direction is made shorter by an acceleration factor (W).

10. The apparatus according to claim 9, wherein the acceleration factor (W) is the width of excited slab size divided by the width of encoded field of view along the selected acceleration direction (W=th/$FOV_{accel}$).

11. The apparatus according to claim 8, wherein the separation gradient ($G_{sep}$) meets the equation: $G_{sep}/G_{spen} \geq FOV_n/FOV_{accel}$ so that aliased images with distance $FOV_{accel}$ are completely separated in the final outcome image.

12. The apparatus according to claim 11, wherein the equivalent encoded field of view along the image separation direction $FOV'_n$ is expanded according to the equation:

$$FOV'_n = M * FOV_n,$$

where $FOV_n$ is the field of view of a single image along a shift direction n and n is X, Y, or Z dimension, and M is greater than or equal to the acceleration factor (W) so that each cross section of a reconstructed 3D image space accommodates multiple images which are separated by the separation gradient in one graph.

\* \* \* \* \*